United States Patent [19]

Babb

[11] 4,064,489
[45] Dec. 20, 1977

[54] APPARATUS FOR SEARCHING COMPRESSED DATA FILE

[75] Inventor: Edward Babb, Stevenage, England

[73] Assignee: International Computers Limited, Stevenage, England

[21] Appl. No.: 602,273

[22] Filed: Aug. 6, 1975

[30] Foreign Application Priority Data

Oct. 29, 1974 United Kingdom ............... 46651/74

[51] Int. Cl.² .......................... G06F 5/02; G06F 7/34
[52] U.S. Cl. ................................................ 364/200
[58] Field of Search ..................... 340/172.5, 347 DD; 445/1

[56] References Cited

U.S. PATENT DOCUMENTS

| | | | |
|---|---|---|---|
| 3,541,529 | 11/1970 | Nelson | 340/172.5 |
| 3,651,483 | 3/1972 | Clark et al. | 340/172.5 |
| 3,717,851 | 2/1973 | Cocke et al. | 340/172.5 |
| 3,848,235 | 11/1974 | Lewis et al. | 340/172.5 |

*Primary Examiner*—Melvin B. Chapnick
*Attorney, Agent, or Firm*—Misegades, Douglas & Levy

[57] ABSTRACT

A data processing system in which a sequence of records, each record containing data items of various types, is processed. The system is operable in a "remember" mode in which, if a data item of a particular type is not present in a particular record, the result of the last time that type of data item was processed is used as the result for the current record. This permits data files to be stored in a compressed form in which repeated data items are omitted.

4 Claims, 25 Drawing Figures

APPARATUS FOR SEARCHING COMPRESSED DATA FILE

BACKGROUND TO THE INVENTION

This invention relates to data processing systems.

There exists a wide range of applications for data processing systems capable of handling large data files efficiently and rapidly. Such files are typically organised as a sequence of records, each record containing one or more data items of various types. However, the large size of such files creates many problems. In particular, a large amount of storage space is required, and the time taken to search through such a file is usually quite long.

One object of the present invention is to alleviate such problems.

SUMMARY OF THE INVENTION

According to one aspect of the invention, there is provided a data processing system comprising a memory holding a sequence of records, each record comprising one or more data items each item being of one of a plurality of different types, and processing means operable to process the records in sequence in such a manner that the result of processing each record is the same as if that record contained any data item which is present in the preceding record in the sequence and is of a type which does not occur in the current record, thereby permitting data to be stored in the memory in a compressed form in which any data item which is repeated in consecutive records is omitted from the latter of those records.

Compression of a file in this way can result in a substantial saving of storage space and a consequent reduction in the time taken to scan through the file.

According to another aspect of the invention, there is provided a data processing system comprising a memory holding a sequence of records, each record comprising one or more data items each of which is of one of a plurality of different types, and processing means for scanning the records in sequence, selecting data items of a predetermined type, performing a predetermined operation on each selected item and storing the result of the operation in a result store, wherein the processing means is operable in such a manner that, in the absence of any data item of the predetermined type within a particular record, the result from a previous record is retained in the result store as the result for that particular record.

The invention is particularly useful in a processing system in which records are addressed by their contents, rather than by their physical locations.

BRIEF DESCRIPTION OF DRAWINGS

One embodiment of the invention will now be described by way of example with reference to the accompanying drawings of which.

GENERAL DESCRIPTION

Figure 1:
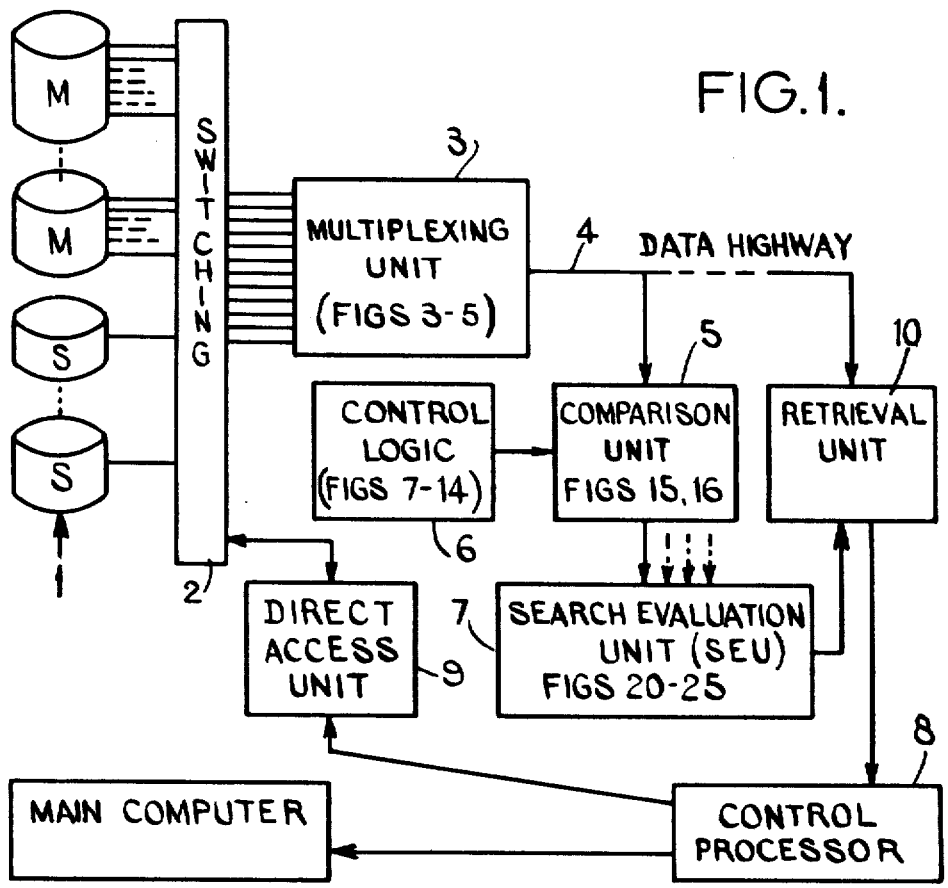
FIG. 1 is an overall block diagram of a data processing system including a number of disc file units, a multiplexing unit, comparison units, control logic for the comparison units, and a search evaluation unit.

Referring to FIG. 1, the system comprises a plurality of magnetic disc file units 1. Each of these units contains a stack of magnetic discs, with a read/write head associated with each recording surface for reading data from or writing data to a track on that surface. The heads are radially positionable to select any desired "cylinder" of tracks from the discs. Some of the units, denoted by the letter S, are of a type in which only a single head can be activated at a time, and hence each provides only one output data channel. The remaining units, denoted by the letter M, are capable of having a plurality of their heads activated simultaneously and hence can provide a plurality of parallel output channels (in this example, ten channels each).

Data stored in the disc units 1 is logically organised into files. Each file may, for example, consist of a given cylinder, or may extend across several cylinders (and possibly even across several disc units). Alternatively, there may be several files in a cylinder. Each file comprises a number of records, and each record comprises a number of fields. For example, a file might represent a list of parts held in stock, with one record for each part, each record containing fields representing part number, price, stock level, delivery time and so on.

The data channels read from the disc units are all applied to a switching unit 2, which selects up to twelve of these channels and applies them to the twelve input ports of a multiplexing unit 3. The unit 3 combines these twelve data channels together to produce a time-division multiplexed signal on a data highway 4. It should be noted that not only the data is multiplexed, but also control information which is present on each track. As will be seen, this allows the control hardware for dealing with this control information to be time-shared among all twelve data channels and therefore minimises the amount of such hardware required. However, each channel is dealt with independently of all the other channels. Therefore the channels which are multiplexed together can all be completely independent, and need not be synchronised in any way. Thus, if they are derived from separate surfaces of one of the multiple units M, it is not necessary to ensure that the data on these surfaces is aligned in any way. Moreover, the multiplexed channels can be derived from separate disc units.

The multiplexing unit also provides the following control signals to qualify the data on the highway 4: a channel number indicating which channel the data is derived from; and a physical address indicating where the data originated from on the disc.

The multiplexed data on the highway 4 is applied in parallel to a bank of 16 comparison units 5 (only one is shown). These units share a common control circuit 6. Each comparison unit is time shared between the twelve data channels, and operates completely independently on each channel. For a given data channel, the operation is basically as follows. The comparison unit compares each data field appearing on the highway 4 with a stored key value. The results of these comparisons are accumulated (i.e. ORed together) and at the end of the record are stored in a memory in the comparison unit.

At the end of a record, the stored results appropriate to that record are transferred to a search evaluation uni (SEU) 7. This unit performs logical operations on the results in accordance with a stored program so as to decide whether the record satisfies a specified search criterion. To ensure that the comparison results do not appear faster than the SEU can evaluate them, a minimum record length is specified (in this case, 16 bytes), and it is arranged that the longest evaluation sequence in the SEU takes no longer than 16 byte periods.

The data on the highway 4, along with the qualifying control signals, is also applied to a retrieval unit 10 whose purpose is to retrieve specified items of information from those records which satisfy the search criterion. Since a record is not processed by the SEU until after it has been scanned, the retrieval unit 10 must contain buffers for temporarily holding the specified items until the evaluation has been completed.

The retrieved information is passed, along with its associated physical address, to a control processor 8. This is a conventional, small processor which co-ordinates the operation of all the parts of the system so far described. In addition, the control processor may obtain access to the data base by means of a direct access unit 9, which operates in parallel with but independently of the rest of the system, and which has a direct access to the disc file units 1 by way of the switching unit 2.

The whole system as described so far may be regarded as a peripheral attached to a conventional main frame computer which issues appropriate high-level commands to the control processor 8 in response to user programs.

DISC FORMAT

Figure 2:
FIG. 2 shows the data format for the disc file units.

Referring now to FIG. 2, this shows the format of data in the disc units 1. Each data track contains fifteen blocks of data, referred to as data areas DA, spaced evenly around the track. Each data area contains 384 eight-bit bytes of data. It should be emphasised that these data areas DA do not correspond to the records referred to above: each data area may contain several records or, alternatively, each record may extend over several data areas on the same track.

Each data area DA is preceded by a marker pattern, nine bytes long, referred to as the count area CA, which uniquely identifies the data area within the disc unit. Thus, each count area contains:

a. A cylinder number, identifying the radial position of the track.

b. A head number, identifying which head the track corresponds to.

c. A count area number (from 0 to 14) identifying the circumferential position of the area within the track.

Each data area DA or count area CA is immediately preceded by the following sequence:

a. A preamble PA, consisting of eight bytes of binary ones, which is used for synchronising clock timing circuits.

b. An address mark AM, which is a unique fixed pattern of bits, 7 bytes in length, and serves to mark the beginning of the following count area or data area.

c. A sync byte S, which identifies the nature of the following area (i.e. count area or data area).

Each data area DA or count area CA is immediately followed by two cyclic check bytes CC which are used during reading to verify the data read from that area. The first cyclic byte is equal to the exclusive-OR function of an all-ones byte with every second byte in the area, starting from the first byte. Similarly, the second cyclic check is an exclusive-OR of an all-ones byte with every second byte in the area, starting from the second byte.

The shaded areas in FIG. 2 represent gaps in which no information is recorded.

MULTIPLEXING UNIT

Figure 3:
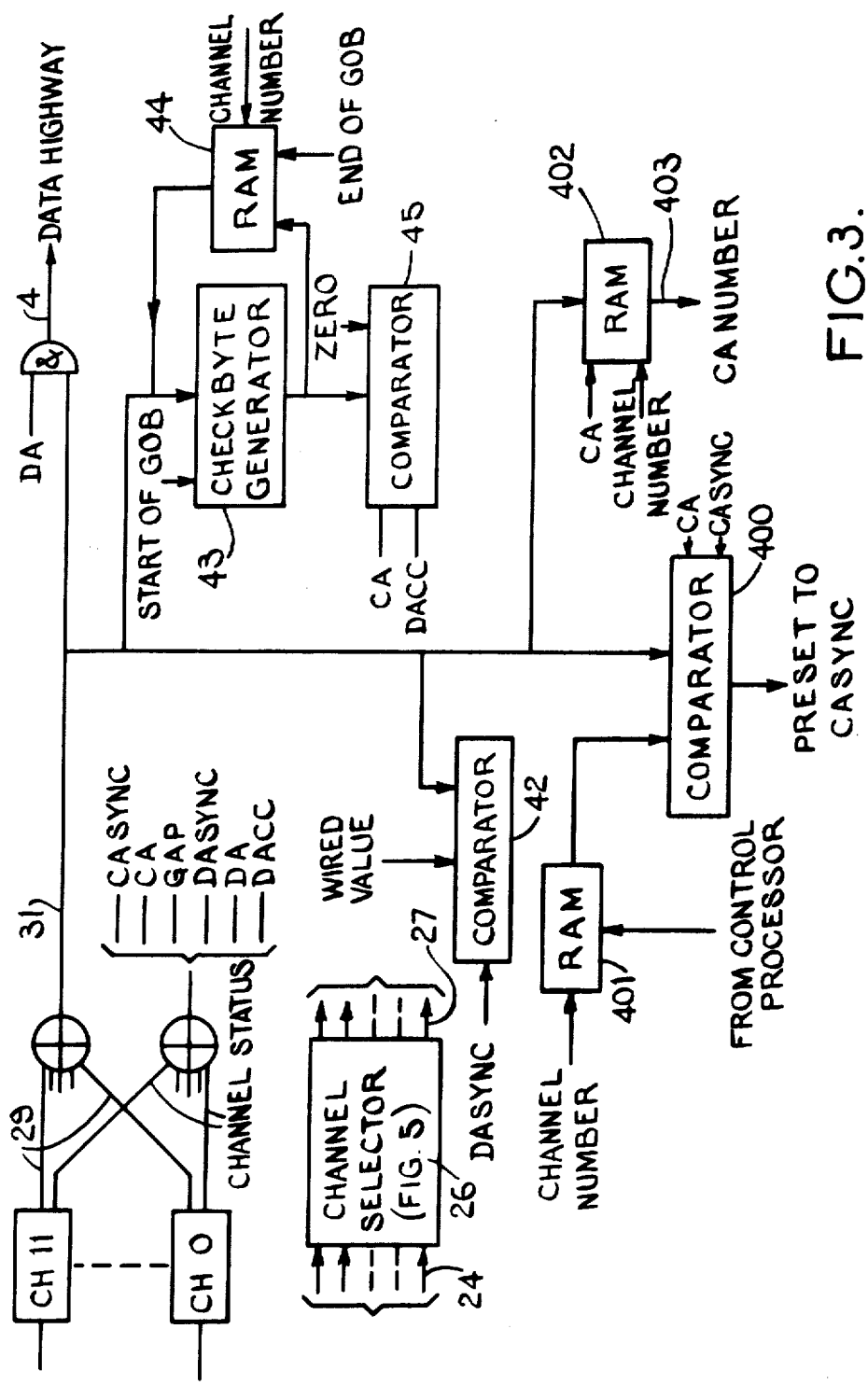
FIGS. 3 – 5 show the multiplexing unit.
Figure 4:
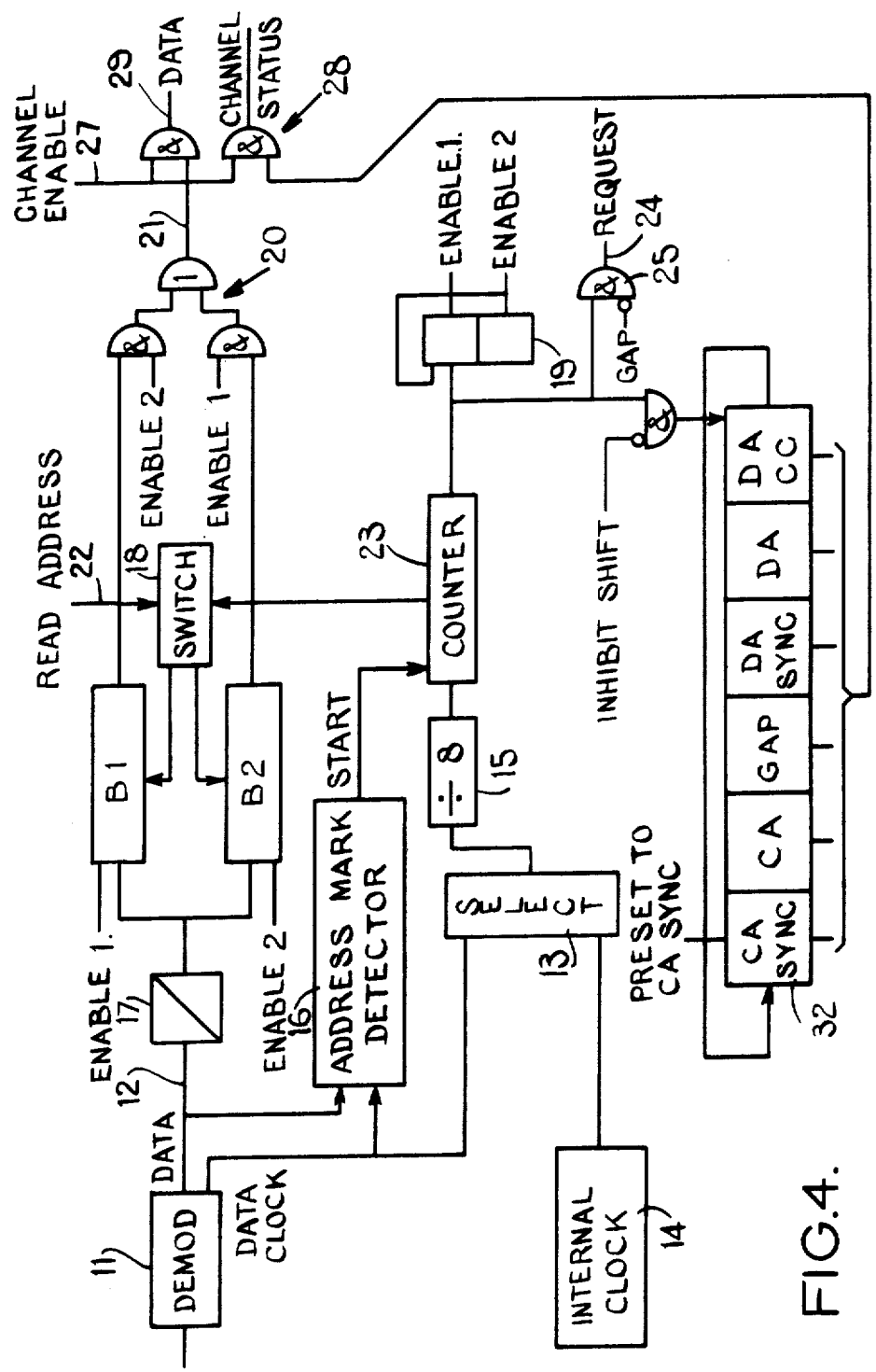
Figure 5:
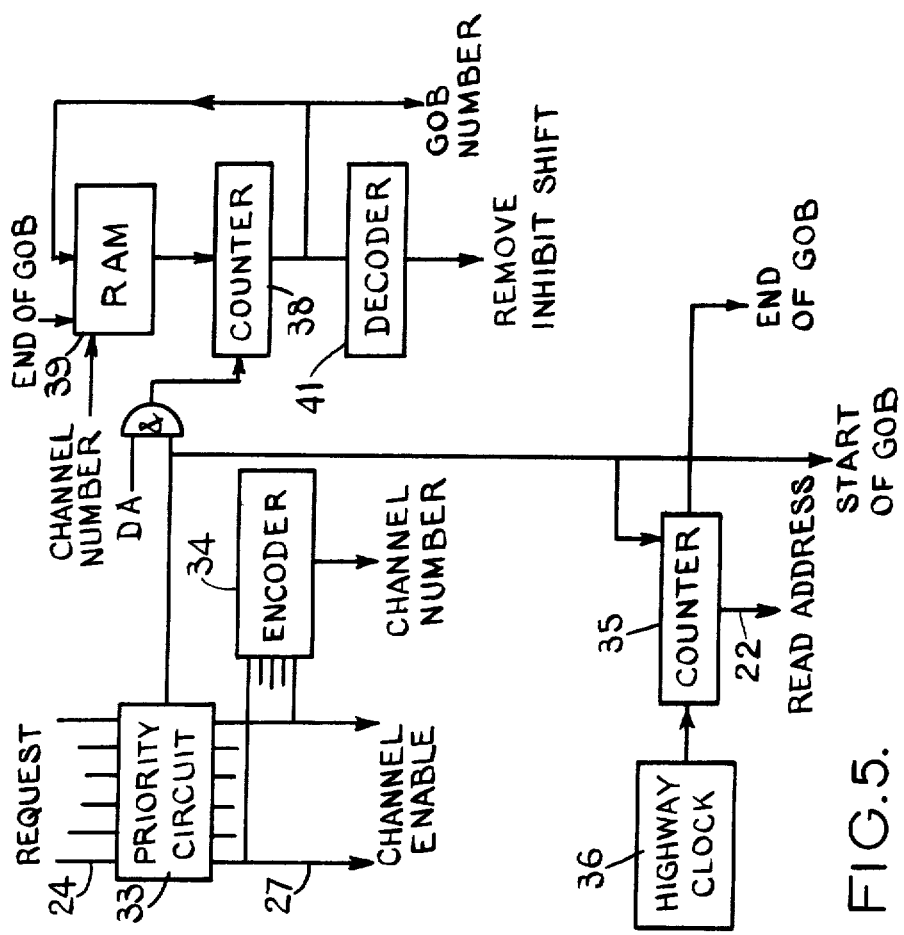

FIGS. 3 to 5 show the multiplexing unit 3 in greater detail.

Referring to FIG. 3, the raw data from the twelve channels selected by the switching unit 2 is applied to 12 channel units CH0–CH11. The data rate at this point is, of course, the speed of reading data from a track of the disc and is nominally 2.5 megabits per second.

One of these channel units is shown in detail in FIG. 4. The unit includes a demodulation circuit 11 which demodulates the raw data, and extracts a clock signal from the data. (This clock signal is, of course, only produced during reading of the actual recorded areas, and is undefined during the gaps).

A selector circuit 13 is provided to select either this data clock signal, or a clock signal from an internal clock unit 14 (having a slightly slower clock rate than the data clock) to act as the master clock signal for the channel unit. This master clock signal is applied to a divide-by-eight counter 15 so as to step it down from the bit frequency to the byte frequency.

The demodulated data on path 12 is applied to an address mark detector circuit 16 of conventional form, which is arranged to recognise the unique pattern of bytes constituting an address mark AM. Whenever the circuit 16 detects the start of an address mark (namely, an all-zeros byte following an all-ones byte), it produces a START signal.

The demodulated data is also applied to a serial-to-parallel converter 17, to convert it from bit-serial to byte-parallel form. The output of the converter 17 is applied to a pair of buffers B1 and B2, each of which is a 16-byte random access memory. These buffers are controlled by a bistable circuit 19, connected as a divide-by-two counter, in such a manner that the buffers are enabled for writing alternately. For convenience, the buffer which is currently enabled for writing will be referred to as the current buffer, while the other will be referred to as the non-current buffer. The data outputs from the buffers are applied to a data selector circuit 20 which is also controlled by the bistable 19, so as to select data from the non-current buffer for output on to a path 21.

Addressing of the buffers is also controlled by the bistable circuit 19 by way of a switching circuit 18, as follows: the non-current buffer is addressed by a four-bit READ ADDRESS signal on a path 22, while the current buffer is addressed by the contents of a four-bit counter 23. This counter is incremented by the byte-rate clock signal from the counter 15. The overflow of the counter 23 indicates that the current buffer is full of data and is therefore used to switch the bistable 19 into its opposite state, so as to interchange the roles of the buffers. The overflow output also produces a REQUEST signal on a line 24, provided an AND gate 25 is enabled.

Referring again to FIG. 3, the request lines 24 from the 12 channel units are applied to a channel selector unit 26 which services outstanding requests one at a time, by issuing a CHANNEL ENABLE signal to the appropriate channel unit over one of 12 lines 27. The channel selector unit also produces a sequence of READ ADDRESS signals, from 0 to 15, which are applied to the address paths 22 of the channel units, so as to cause the contents of the non-current buffers to be read out in sequence, a byte at a time. This read-out takes place at a rate of 235 nanoseconds per byte. As shown in FIG. 4, the CHANNEL ENABLE signal activates a set of gates 28 in the selected channel unit, allowing data from the non-current buffer to be read out on to a byte-wide output path 29. As shown in FIG. 3, the signals on the paths 29 are combined in a wired-OR connection to produce a multiplexed signal on a byte-wide common output path 31.

It should be noted that the rate at which data is read out of the buffers is slightly greater than 12 times the rate at which it is read in. This provides a one-byte gap between data from different channels so as to allow time for the following parts of the system to switch from one channel to the other. It also allows for small fluctuations in the rotational speed of the discs, which can result in data being read from the discs faster than the nominal rate. It should also be noted that the order in which the data channels are multiplexed is not necessarily fixed, since it is determined by the channel selector in response to request signals rather than on a fixed cyclic basis.

Referring still to FIG. 4, each channel unit contains a six-stage cyclic shift register 32, referred to as the sequencer, which controls the operation of the unit. At any time, one of these stages contains a one and the others all contain zeros, so that the sequencer has six successive states. These six states basically correspond to the following six regions on the disc (cf. FIG. 2):

CASYNC: a sync byte preceding a count area.
CA: a count area
GAP: a gap following a count area
DA SYNC: a sync byte preceding a data area
DA: a data area
DACC: cyclic check bytes following a data area.

Initially, the sequencer is preset to the CA SYNC stage, prior to reception of an address mark AM preceding a count area. In this state, the address mark detector 16 is enabled, so that when the start of the address mark AM is detected, a START signal is produced. This presets the counter 23 to a value of eight, and enables it. The counter will then count up, so as to gate the address mark AM and the following count area sync byte S into bytes 8 - 15 of the current buffer. A REQUEST signal will then be produced on line 24, requesting the channel selector unit to read out the contents of the buffer. At the same time, the counter overflow signal causes the buffers to be interchanged, and also shifts the sequencer 32 to the CA state.

In the CA state, the counter 23 continues counting, causing the count area CA and its cyclic check bytes CC to be gated into bytes 0 - 10 of the current buffer. When the count reaches ten, the selector 13 is switched over to the internal clock signal. Counting continues up to fifteen. A REQUEST will then be produced, and the sequencer 32 shifted on to the GAP state.

In the GAP state, counting continues. However, in this state the REQUEST signal is inhibited, since the gate 25 is disabled, and so no information is read out on to the output path 29. The length of the gap, and the frequency of the internal clock are such that, when the counter 23 next overflows, the preamble PA preceding the next address mark will have started arriving from the disc, so that the data clock signal will be available again. Therefore, the overflow signal causes the selector 13 to switch back to the data clock signal. At the same time, the sequencer is shifted on to the DA SYNC state and the counter 23 is disabled.

In the DA SYNC state, the address mark detector 16 is again enabled. Thus, when the beginning of the address mark is detected, a START signal is produced, presetting the counter 23 to eight and enabling it. The counter will then run, gating the address mark and the data area sync byte into bytes 8 - 15 of the current buffer. When counter overflow occurs, a REQUEST signal is issued and the sequencer is shifted on to the DA state.

In the DA state, shifting of the sequencer is inhibited by an INHIBIT SHIFT signal. Thus, the counter 23 repeatedly counts from 0 up to 15, causing successive groups of 16 bytes of the data area DA to be gated into alternate buffers. As before, a REQUEST signal is issued at the end of each group of bytes. The INHIBIT SHIFT signal is maintained until the last group of bytes in the data area is being gated into the current buffer, whereupon it is removed, allowing the sequencer to shift on to the DACC state.

In the DACC state, the counter 23 continues running, and gates the two cyclic check bytes CC into bytes 0 and 1 of the current buffer. When the count reaches one, a signal is produced which switches the selector 13 over to the internal clock. Counting then continues, until counter overflow occurs, resulting in another REQUEST signal, and causing the sequencer to be shifted back to the initial CA SYNC state. At the same time the selector 13 is switched back to the data clock, and the counter 23 is disabled. The channel unit now awaits the arrival of the next address mark, as before.

Thus, it will be seen that the channel unit arranges the data from its corresponding data channel into a series of groups of 16 bytes each. Each data area DA, consisting of 384 bytes, is divided into 24 such groups of bytes. Each address mark and its following sync byte are placed together in bytes 8 - 15 of a group, the other bytes being left empty. Similarly, each count area and its cyclic check bytes are placed in bytes 0 - 10 of a group, the other bytes being left empty, while the data area cyclic check bytes are placed in bytes 0 and 1 of an otherwise empty group.

As shown in FIG. 4, the gates 28 also gate out the state of the sequencer upon receipt of a CHANNEL ENABLE signal, to produce a CHANNEL STATUS signal which is combined in a wired-OR connection with similar signals from the other channels.

Referring now to FIG. 5, this shows the channel selector unit 26 in greater detail. The selector unit includes a priority circuit 33 which selects one of the REQUEST signals on lines 24 for servicing and produces a CHANNEL ENABLE signal on the corresponding one of the lines 27. At the same time, the identity of the selected channel is encoded by a circuit 34 to produce a four-bit CHANNEL NUMBER.

The priority circuit 33 then activates a four-bit counter 35, driven by a highway clock signal from a clock circuit 36. The counter 35 counts up from 0 to 15, producing a sequence of READ ADDRESS signals for reading out a group of 16 bytes from the selected channel unit. When the counter overflows, it stops, and applies a signal back to the priority circuit 33, initiating the selection of the next request. The signal which initiates the reading of a group of bytes is referred to as the START OF GOB signal, while the overflow signal at the end of the group of bytes is referred to as the END OF GOB signal.

The channel selector unit also includes a counter 38 for counting the number of groups of bytes which have been read from a data area, this counter being incremented by one at each START OF GOB when the CHANNEL STATUS signal indicates that the selected channel is in the DA state. To cope with the multiplexing of the channels, the contents of this counter 38 are stored away in a random access memory 39, which is addressed by CHANNEL NUMBER, at the end of each group of bytes, and the counter is reloaded from the memory at the start of each group of bytes. Thus, it will be seen that the counting for each channel proceeds completely independently. The output of the counter 38 is applied to a decoder circuit 41, which detects when the count reaches 22 for the currently selected channel, indicating that the second last group of bytes in a data area is being read out of the non-current buffer in that channel. This means that the last group of bytes in the data area is being written into the current buffer of that channel. Therefore the output of the decoder 41 is used to remove the INHIBIT SHIFT signal from the sequencer of the enabled channel.

The output from the counter 38 is referred to as GOB NUMBER, and constitutes part of the physical address which qualifies the data on the highway 4.

Referring once more to FIG. 3, the CHANNEL STATUS signal is used to determine what is to be done with the signals on the path 31, as follows.

When CHANNEL STATUS indicates the CA or the CASYNC state, a comparator circuit 400 is enabled to compare the count area and its sync byte with the output of a random access memory 401. This memory is divided into twelve areas, one for each data channel, one of these areas being selected by CHANNEL NUMBER. Each of these areas contains the expected value of the count area sync byte, and of the count area corresponding to a data area which it is desired to scan. If the comparator 400 indicates a mismatch for the sync byte or the count area, the sequencer of the enabled channel is reset to the CASYNC state.

If, on the other hand the comparator 400 detects a match for the count area, and sync byte, a signal is sent to the control processor to inform it of this fact. The control processor will then update the appropriate area of the memory 401 by writing into it the appropriate details of the next count area which is to be matched. In this way, the control processor can select any desired sequence of data areas for scanning by the system, this selection being exercised independently for each channel.

Also, in the CA state, another random access memory 402 is enabled, to permit the byte on path 31 containing the count area number to be written into the location of the memory 402 addressed by the current channel number. The contents of the currently addressed location of this memory provide a signal or path 403 referred to as CA NUMBER which constitutes (along with GOB NUMBER) the physical address qualifying the data on the highway 4.

When the DA SYNC state occurs, the group of bytes appearing on path 31 is gated to a comparator circuit 42 where byte fifteen is checked against a fixed wired-in value to determine whether it is a valid data area sync byte. If not, an error signal is sent to the control processor.

When the DA state occurs the successive groups of bytes appearing on the path 31 are gated on to the data highway 4 (FIG. 1) and hence to the comparison units 5.

The data on path 31 is also applied to a check-byte generating circuit 43 which generates checkbytes on each count area and its cyclic checkbytes, and on each data area and its cyclic checkbytes. Normally, the checkbytes so generated will be all zero. The circuit 43 has a random access memory 44 associated with it. This memory is addressed by CHANNEL NUMBER and is used to store the state of the checkbyte generator at the end of each group of bytes, and to reload it at the start of each new group of bytes, thus ensuring that the generation of checkbytes for different channels proceeds independently.

When the CA or the DACC occurs, a comparator 45 is enabled causing the checkbytes generated by the circuit 43 to be compared with a wired-in all-zero pattern. If a mismatch is indicated in the DACC state, an error is signalled to the control processor. A mismatch in the CA state, on the other hand, causes the sequencer of the enabled channel unit to be reset to the CA SYNC state.

It should be noted that the control circuits shown in FIG. 3 for matching count areas, checking sync bytes and so on are time-shared among all twelve channels, thus reducing the amount of control hardware.

RECORD FORMAT

Figure 6:
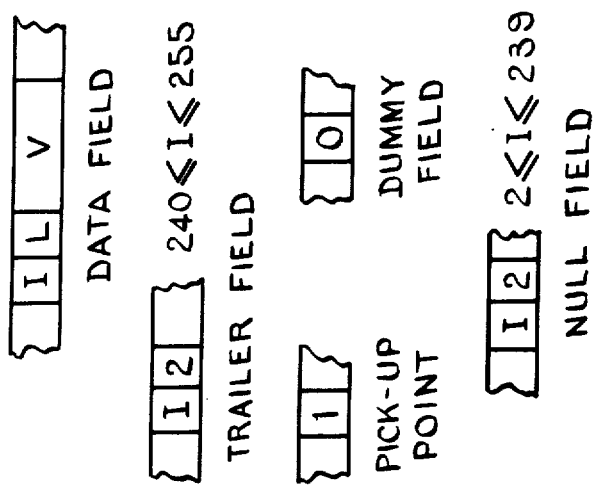
FIG. 6 shows the format of a record.

Referring now to FIG. 6, this shows the format of data within a record. The record comprises a succession of data fields, each field consisting of:

a. An identifier byte I, representing the nature of the data field. For example, in the case of the inventory file, the identifier I would be a code signifying "part number", "price," and so on.

b. A length byte L, representing the length, in bytes, of the data field, including the bytes I and L.

c. A value portion V of variable length, containing the actual value of the data. For example, if the identifier byte I signifies "part number," the value portion V will contain the part number itself.

Each record is terminated by a trailer field consisting of a special identifier byte I, having a value in the range 240 to 255, and a length byte L.

A portion of a typical file consisting of a number of such records is shown in the following table 1. In this table, the fields of a record are shown, for clarity, on the same line. Identifier bytes are denoted by the letters X, Y, Z, while the field values are denoted by the symbols X1, Y1, Z1 etc. Thus, the notation $X = X1$ represents a field having an identifier X and a value X1. Length bytes, and record trailers are omitted from the table.

TABLE 1.

| Record No. | Fields. | | |
|---|---|---|---|
| 1 | X = X1 | Y = Y1 | Z = Z1 |
| 2 | X = X1 | Y = Y1 | Z = Z2 |
| 3 | X = X1 | Y = Y1 | Z = Z3 |
| 4 | X = X1 | Y = Y2 | Z = Z4 |

It will be seen from this table that certain fields are repeated in consecutive records. For example, the field $X = X1$ appears in all four records. This feature frequently occurs in data files. For example, in the case of the inventory system, successive records may relate to parts which are used on the same sub-assembly, and so on.

As will be described, the present system permits such a file to be stored in a more compact form, by eliminating the repeated fields from successive records. Using this principle, the file in Table 1 can be compressed to the form shown in Table 2.

TABLE 2.

| Record No. | Fields. | | |
|---|---|---|---|
| 1 | X = X1 | Y = Y1 | Z = Z1 |
| 2 | | | Z = Z2 |
| 3 | | | Z = Z3 |
| 4 | | Y = Y2 | Z = Z4 |

It can be seen that the number of stored fields has been reduced from 12 in Table 1 to 7 in Table 2, so that there is a corresponding reduction in required storage space.

If data is stored in this way, some means must be provided for "remembering" information from one record to the next when the file is scanned. For example, in Table 2, the fields X = X1 and Y = Y1 in record 1 must be effectively remembered since they are to be treated as being present in record 2 (See Table 1). Clearly, in the above example, any scanning of the file must be commenced at record 1, or else errors will occur. For example, if scanning began at record 2 the fields X = X1 and Y = Y1 would not have been remembered, and there would be no way of knowing that they were intended to appear in record 2. To overcome this problem, the present system uses a special field, referred to as a pick-up point, which is placed between records at intervals so as to indicate possible starting positions. The data is then so arranged that information does not have to be remembered across pick-up points, i.e. the first record after each pick-up point does not have any omitted fields.

Table 3 shows another portion of an uncompressed data file.

TABLE 3.

| Record No. | Fields. | | |
|---|---|---|---|
| 1 | X = X2 | Y = Y3 | Z = Z5 |
| 2 | X = X2 | | Z = Z6 |
| 3 | X = X2 | | Z = Z7 |

In this case, it will be seen that the Y field is actually required to be absent from records 2 and 3. Thus, when this data file is compressed, there must be some way of preventing the field Y = Y3 from being remembered from record 1. This is achieved by the use of a special NULL field, which indicates that the field is not present in the record. The file shown in Table 3 would therefore be compressed to the form shown in Table 4.

TABLE 4.

| Record No. | Fields. | | |
|---|---|---|---|
| 1 | X = X2 | Y = Y3 | Z = Z5 |
| 2 | | Y = NULL | Z = Z6 |
| 3 | | | Z = Z7 |

The NULL field can be remembered in the same way as a normal field, as illustrated in the case of record 3 in the above Table 4.

Referring again to FIG. 6, this shows the format of a pick-up point. This consists of the special identifier byte 1, with no length byte or value portion. FIG. 6 also shows a NULL field, which consists of a normal field identifier byte I and the length byte 2, but not value portion. This figure also shows a DUMMY field, consisting of the identifier byte 0, which can be used for filling spaces in data areas.

As will be described, the present system is operable in two modes. The first mode is called the normal mode, and in this state the system can only handle uncompressed data files such as shown in Tables 1 and 3.

The second mode is called the remember mode, and in this state the system can effectively "remember" the results of comparisons made on fields, and can therefore deal with compressed files such as shown in Tables 2 and 4.

COMPARISON UNIT CONTROL LOGIC

The comparison unit control logic circuit 6 is shown in more detail in FIGS. 7 - 14. The timing of this control logic is controlled by a master clock signal $Ck$ which is derived from the highway clock signal (FIG. 5). The clock signal $Ck$ is, however, only present when the CHANNEL STATUS indicates that a data area is present on the highway 4.

Figure 7:
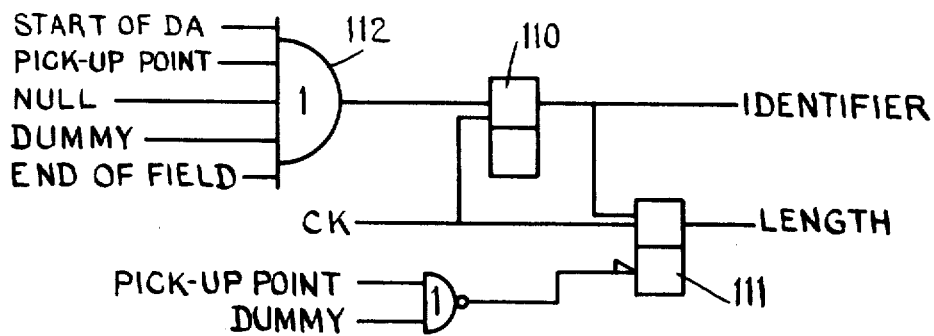
FIGS 7 – 14 show the control logic unit.

Referring to FIG. 7, the control logic circuit contains two D-type bistable circuits 110, 111. Bistable 110, when set, produces an IDENTIFIER signal, which indicates the presence of an identifier byte on the data highway 4. Bistable 111, when set, produces a LENGTH signal which denotes the presence of a length byte on the highway.

The bistable 110 is initially set, by way of an OR gate 112, by a START OF DA, signal, which is derived from CHANNEL STATUS (FIG. 3) and indicates the arrival of the first byte in a data area, which will always be an identifier byte. As will be explained, the OR gate has other inputs for setting the bistable 110 for subsequent identifier bytes. The bistable 110 is reset at the first clock pulse $Ck$ after the output of the OR gate 112 returns to "O."

The bistable 111 receives the IDENTIFIER signal from the bistable 110 and is set at the first clock pulse $Ck$ following that signal unless it simultaneously receives a reset signal. The bistable 111 is reset at the first clock pulse $Ck$ after the IDENTIFIER signal is removed.

Figure 8:
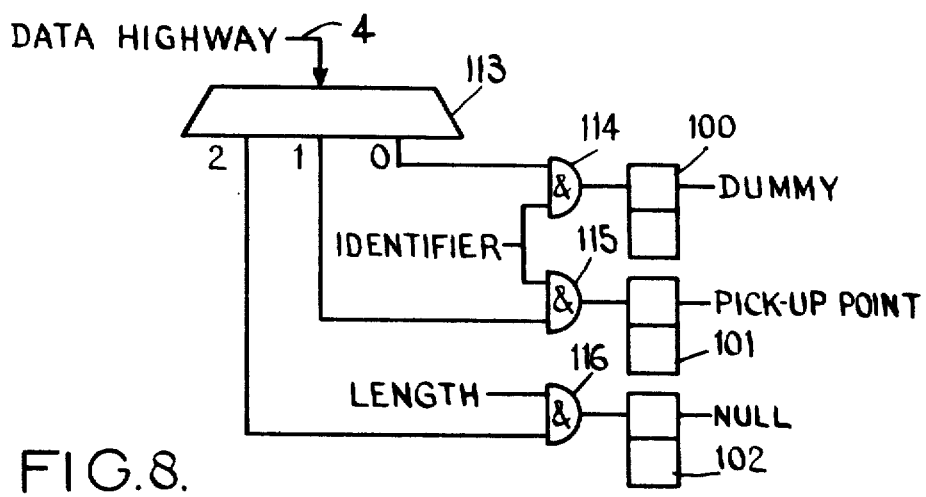

Referring now to FIG. 8 each data byte on the highway 4 is applied to a decoder 113 which is arranged to detect bytes equal to 0, 1 and 2. The 0 output of the decoder 113 is combined in an AND gate 114 with the IDENTIFIER signal, to set a bristable 100, producing an output signal DUMMY upon occurrence of a DUMMY identifier. Similarly, the 1 output of the decoder is combined in an AND gate 115 with the IDENTIFIER signal to set a bistable 101 and to produce an output signal PICK-UP POINT upon occurrence of a pick-up point identifier. The DUMMY and PICK-UP POINT signals are applied to the OR gate 112 so as to prevent the bistable 110 from being reset at the next clock pulse. This is necessary because the next byte following a dummy or a pick-up point identifier will always be another identifier byte. The signals DUMMY and PICK-UP POINT are also applied, after inversion, to the reset input of the bistable 111 so as to prevent this bistable from being set, since a dummy field or a pick-up point has no length byte.

The 2 output of the decoder 113 is combined, in an AND gate 116, with the LENGTH signal, so as to set a bistable 102 and to produce an output signal NULL upon occurrence of a field having a length byte equal to 2 (i.e. a null field). The NULL signal is also applied to the OR gate 112, so as to cause the bistable 110 to be set again at the next clock pulse Ck, i.e. upon arrival of the next byte, which will be the identifier byte of the next field following the null field.

Figure 9:
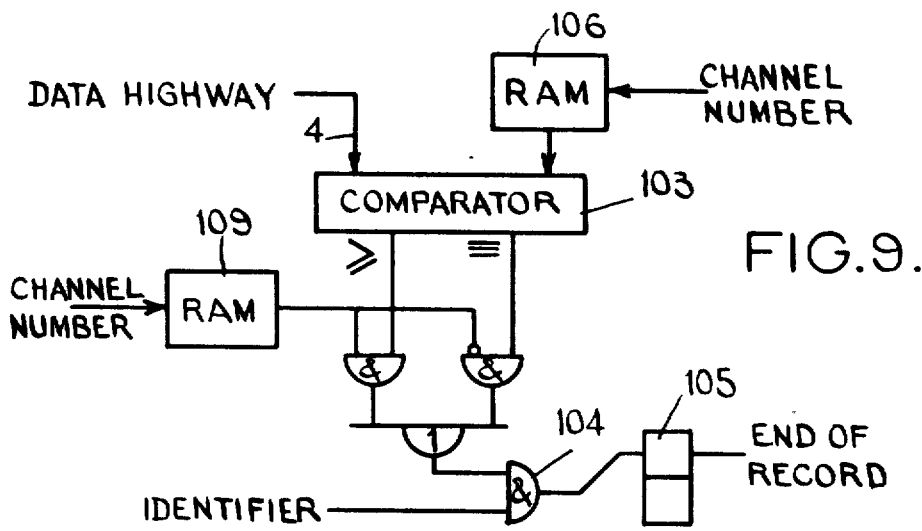

Referring now to FIG. 9, each byte on the highway 4 is applied to a comparator 103 where it is compared with a threshold value in the range 240-255. The comparator has two outputs, "not less than" and "equals." One or other of these outputs is selected by a control bit, and applied to an AND-gate 104 along with the IDENTIFIER signal. When gate 104 is enabled, it sets a bistable 105 producing an END OF RECORD signal, indicating the presence of a trailer identifier.

The threshold value is obtained from a random access memory 106 which is addressed by CHANNEL NUMBER so as to select a particular threshold value for each channel. Similarly, the control bit is obtained from a random access memory 109 which is addressed by CHANNEL NUMBER.

In operation, the control processor loads the memory 109 with bits to determine which output of the comparator is to be used for each channel and loads the memory 106 with the desired threshold values for each channel. The setting of these memories determines which identifiers are recognised as trailer identifiers for each channel. For example, if the threshold for a particular channel is set at 248, and the "not less than" output is selected for that channel, only identifiers in the range 248 to 255 will be recognised as trailer identifiers and produce an END OF RECORD signal.

Thus, it can be seen that by varying the contents of the memories 106, 109 the boundaries of records in the system can be effectively varied.

Figure 10:
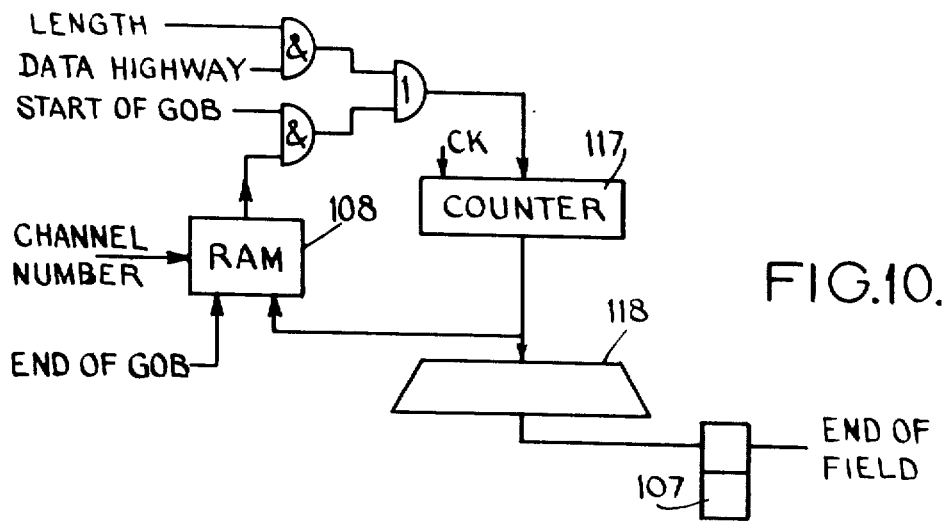

Referring now to FIG. 10, the control logic also includes a counter 117 which is reset to zero by the identifier signal and is pre-loaded with a byte from the data highway 4 by the length signal. The counter is decremented by unity at each clock pulse Ck. Thus, it will be seen that the counter 117 is loaded with the length byte and then decremented as successive bytes of the field appear. Therefore, when the counter 117 reaches a count of 2, the last byte of the field must be present on the highway. The counter = 2 state is detected by a decoder 118, setting a bistable 107 and producing an output signal END OF FIELD. The END OF FIELD signal is also applied to the OR gate 112, so as to cause the bistable 110 (FIG. 7) to be set again at the next clock pulse; i.e. upon arrival of the next byte, which will be the identifier byte of the next field.

To cope with the multiplexed nature of the data on the highway 4, the contents of the counter 117 are stored away in a random access memory 108 at the end of each group of bytes on the highway. The memory 108 has 12 locations, and is addressed by the CHANNEL NUMBER, so as to ensure that the contents of the counter 117 for different channels are always stored in separate locations. At the start of each new group of bytes, the counter is preloaded with the output from the currently addressed location of the memory.

Figure 11:
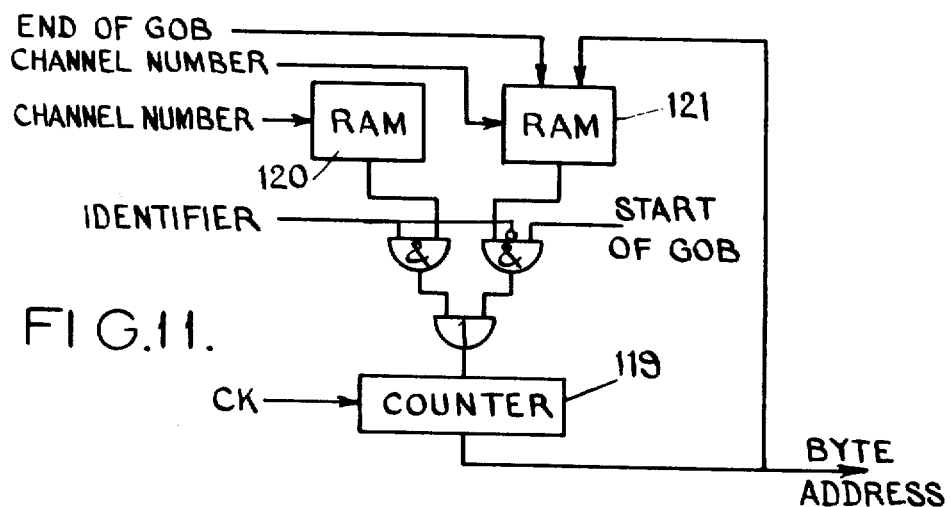

Referring now to FIG. 11, the control logic also includes another counter 119, the output of which provides a BYTE ADDRESS which is used to address the key stores in the comparison units 5 as will be described. This counter is loaded with a datum value, from a random access memory 120, whenever an IDENTIFIER signal occurs. The memory 120 is addressed by CHANNEL NUMBER, so that a different datum value may be used for different channels.

To cope with the muliplexed nature of the data, a random access memory 121, addressed by CHANNEL NUMBER, is provided for storing the contents of the counter 119 at the end of each group of bytes, and for reloading the counter 119 at the start of a new group of bytes.

Figure 12:
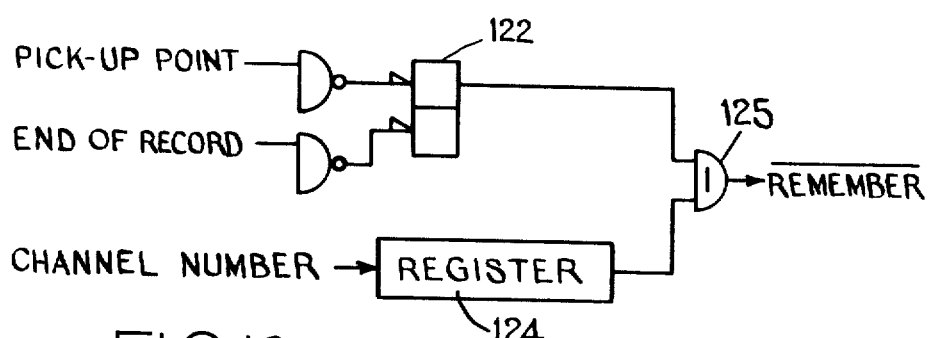

Referring now to FIG. 12, the PICK-UP POINT signal sets a bistable 122 which is subsequently reset by the next END OF RECORD signal. Thus, it will be seen that the set output of bistable 122 marks the first record after a pick-up point.

The mode of operation of the system is controlled by a MODE signal which is "1" when the normal mode of operation is required and is "0" when the remember mode is called for. This signal is derived from a register 124 having a plurality of individually addressable bit locations, one of these locations being selected by CHANNEL NUMBER. Thus, it will be seen that some channels may be processed in the normal mode while others may be processed in the remember mode. The output of the bistable 122 and the MODE signal are combined in an OR gate 125 to produce a signal referred to as the $\overline{\text{REMEMBER}}$ signal. This signal indicates to the comparison units whether or not they are to remember the results of comparisons: in the normal mode $\overline{\text{REMEMBER}}$ is always "1" indicating that no remembering is to take place, while in the remember mode $\overline{\text{REMEMBER}}$ is "0," except for the first record after a pick-up point when, as explained above, remembering is not required.

Figure 13:
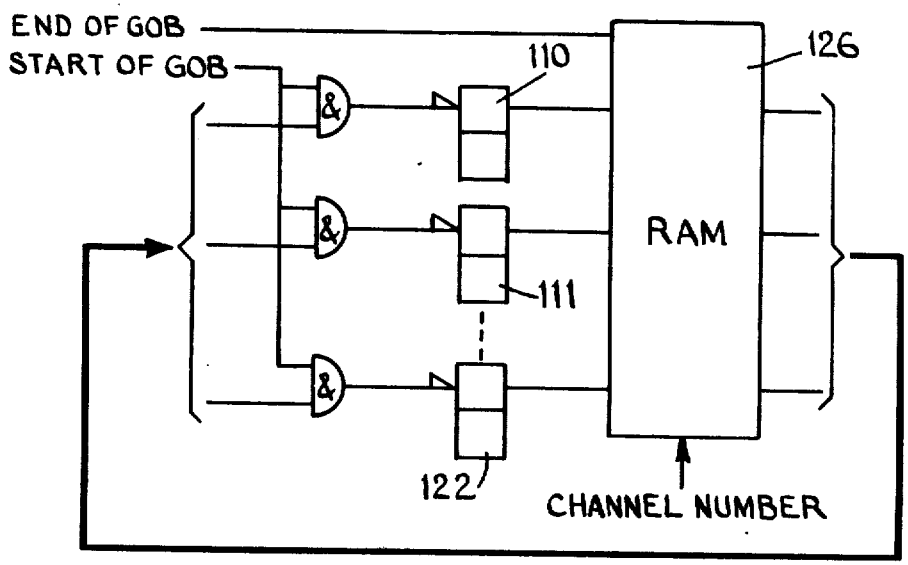

It will be seen that the control logic circuit shown in FIGS. 7 – 12 contains various bistables 110, 111, 100, 101, 102, 105, 107 and 122 which contain control information relating to a particular data channel. Because of the multiplexing of the channels, the states of these bistables must be stored away at the end of each group of bytes from a particular channel, and then reloaded with information appropriate to the next channel to appear on the highway. The way in which this is done is shown in FIG. 13. A random access memory 126 is provided, having 12 word locations, one for each channel, addressed by CHANNEL NUMBER. When an END OF GOB signal appears, the contents of the bistables referred to above are written into the currently addressed word of the memory 126. Conversely, when a START OF GOB signal appears, the contents of the currently addressed word are gated into the respective bistables, prior to the start of the first byte in the group.

Figure 14:
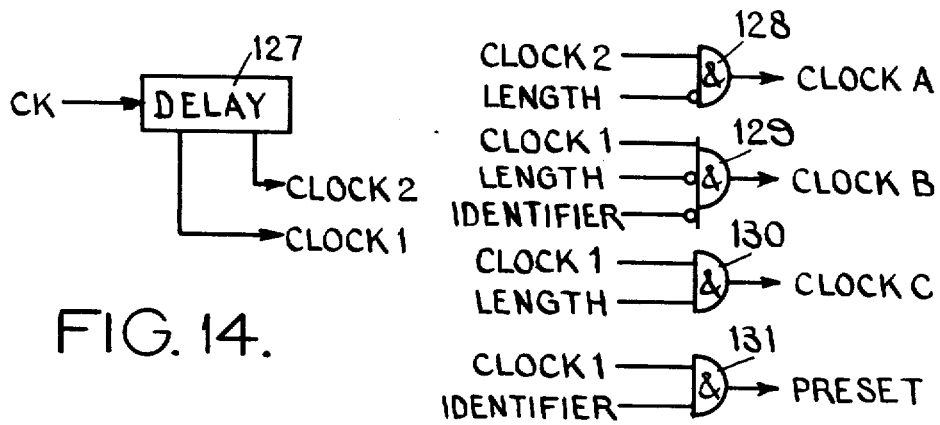

Referring now to FIG. 14, the control logic also produces a set of clock signals referred to as clocks 1 and 2 and clocks A, B and C. Clocks 1 and 2 are derived from the basic clock signal Ck by means of a tapped delay line 127, the delay for clock 2 being the greater. Clock A is derived from clock 2 by way of an AND gate 128 which is inhibited if the LENGTH signal is present. Clock B is derived from clock 1 by way of AND gate 129, but is suppressed during reception of both identifier and length bytes. Clock C is also derived from clock 1, by way of AND gate 130 which is only enabled when the LENGTH signal is present. Another signal, referred to as the PRESET signal, is derived from Clock 1 by way of AND gate 131 which is only enabled when the IDENTIFIER signal is present.

COMPARISON UNITS

Figure 15:
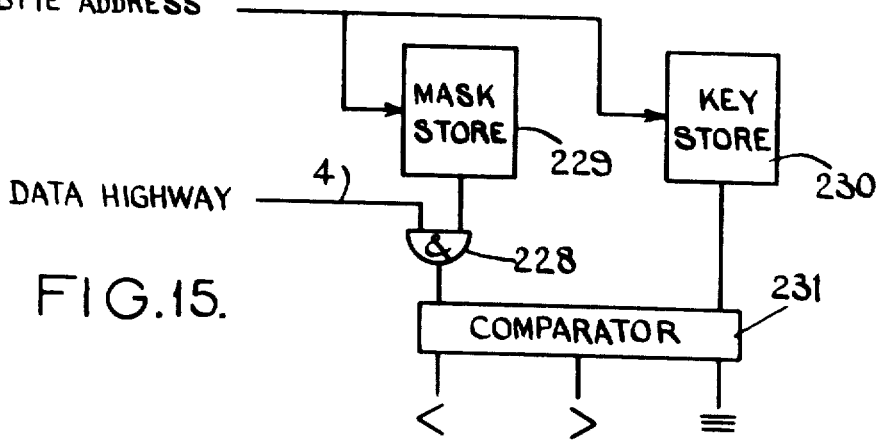
FIGS. 15 – 18 show one of the comparison units, along with some logic common to two such units.
Figure 16:
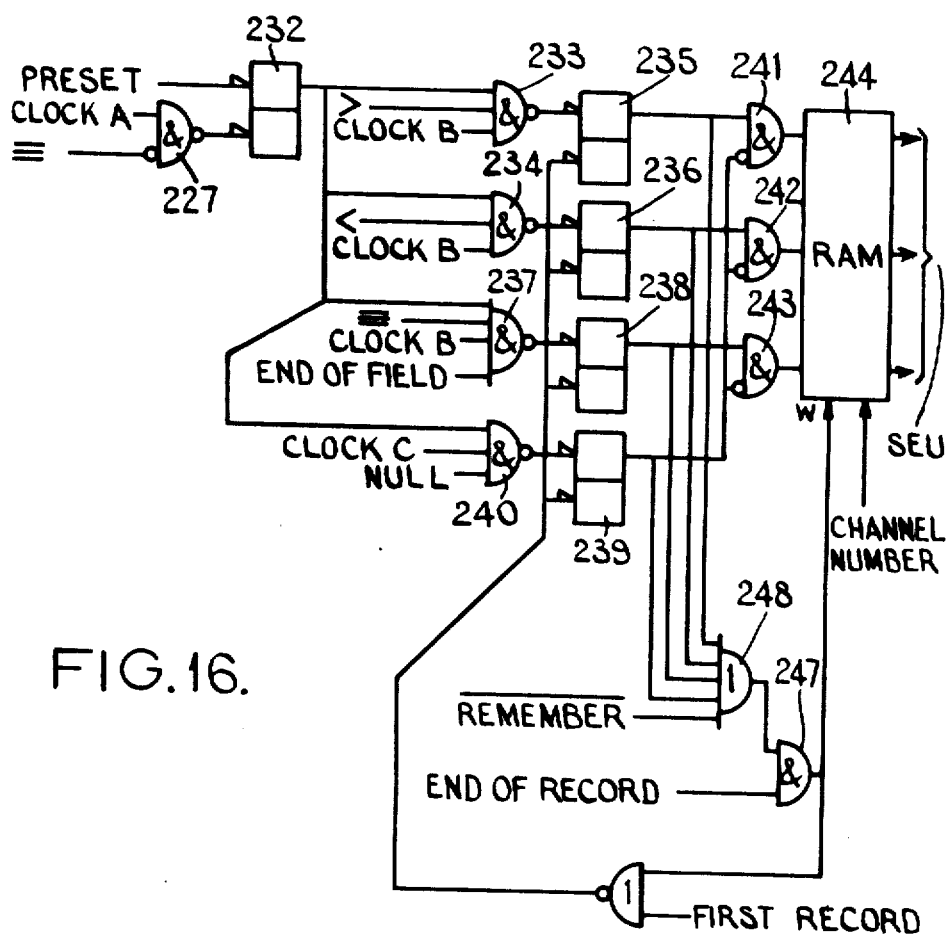

FIGS. 15 and 16 show one of the comparison units 5 in greater detail.

Referring to FIG. 15, each comparison unit includes a random access memory 230, referred to as the key store, which holds the key values for comparison with the incoming data on the highway 4. Each key store holds 256 bytes, and is addressed by the BYTE ADDRESS from the control logic. The format of a key value in the key store is identical to that of a data field as shown in FIG. 6 i.e. it comprises an identifier byte, a length byte, and a value portion of variable length. Each key store may contain several such key values, each key value being stored in sequential byte locations within the key store starting at a datum address corresponding to one of the datum addresses held in the datum memory 120 (FIG. 11).

Thus, it can be seen that, whenever a data field arrives over the data highway 4 from a particular channel a key value corresponding to that channel is read out of the key store in each comparison unit, a byte at a time, in alignment with the data field; i.e. the identifier byte of the key value is read out at the same time as the identifier byte of the data field appears on the highway, and so on.

Each comparison unit also contains another similar random access memory 229, referred to as the mask store, which is also addressed by BYTE ADDRESS. The output of this store is combined in a set of AND gates 228 with the data byte on the highway 4, and the result is applied to one input of a comparator 231, the other input of which receives the output byte from the key store 230. The mask store thus provides the facility for masking, i.e. ignoring selected parts of a data field.

In operation, both the key store and the mask store may be updated as required by the control processor.

The comparator 231 compares the two input bytes and produces one of three output signals according to whether the first input byte is greater than, less than, or equal to the other byte.

Referring now to FIG. 16, at the start of each data field, a bistable latch 232 is set by the PRESET signal. At the same time, the identifier byte of the field is compared with the corresponding byte of the key value. If the two bytes do not match, a NAND gate 227 is enabled at clock A by the inverse of the "equals" output of the comparator 231, and will cause the latch 232 to be reset. It will then remain reset until the beginning of the next field and this effectively terminates the comparison for the present field.

Assuming however that the identifier byte does match, then the latch 232 remains set, and the comparison continues. The length byte is ignored, since clock A is suppressed, but if any byte in the value portion of the field does not match the corresponding byte in the key value, the latch 232 will be reset at clock A. Before this happens, however, the output of the comparator (greater than or less than) is gated by Clock B through NAND gates 233 and 234 into one of two bistable latches 235 and 236. If, on the other hand, no mismatch occurs at all during the comparison, the latch 232 will still be set, and the output of the comparator will still be "equals" when the end of the field occurs. This enables another NAND gate 237, causing another latch 238 to be set. The three latches 235, 236 and 238 are referred to collectively as the field latches, and are all reset at the start of the first record, and at the end of each record, ready for the start of the next record.

It should be noted that since Clocks A and B are both suppressed during reception of the length byte L of each field, that byte is effectively ignored for the purposes of the comparison, and cannot effect the latches 232, 235, 236 and 238.

To summarise the operation of the comparison unit as described so far: each data field initially has its identifier byte compared with that of the stored key value. This is repeated for each field in the record. Thus, at the end of the record, if none of the fields in the record produce an identifier match, the field latches will all remain unset. This condition therefore indicates that the type of field in question is not present in the record. If, however, one of the fields (other than a NULL field) produces an identifier match, the value portion of that field is compared with that of the key value. The result is stored in the field latches and will remain there until the end of the record.

It should be noted that the length of each field comparison (i.e. the number of bytes read from the key store for comparison with the data field) is determined by the length byte L of the data field, since this byte determines when the end of field signal is produced. Thus, for example, if the key value in the key store is eight bytes long, and the data field length is only six bytes, only the first six bytes of the key value will be used for comparison and the remaining two ignored.

A further latch 239 is associated with the field latches. This latch 239 is also reset at the end of each record, and is set upon occurrence of a null field having an identifier I which matches that of the selection key. This is achieved by a NAND gate 240, which receives the set output of latch 232, clock C, and the NULL signal from the control logic.

The contents of the various latches 232, 235, 236, 238 and 239 in the comparison unit are stored away in a random access memory arrangement, similar to that of FIG. 13, at the end of each group of bytes, and reloaded at the start of each new group.

When the latch 239 is reset, three AND gates 241, 242 and 243 are enabled, connecting the output of the field latches to the data input of a random access memory 244. The memory 244 has 12 three-bit word locations, and is addressed by CHANNEL NUMBER. The output from the currently addressed word of this memory is applied to the SEU and represents the results of the comparison performed by the comparison unit.

The write enable input of the memory 244 is connected to the output of an AND gate 247 one input of which receives the END OF RECORD signal from the control logic and the other input of which receives the output of an OR gate 248. The OR gate has five inputs, four of which are connected to the "set" outputs of the three field latches and the latch 239, and the fifth of which receives the $\overline{\text{REMEMBER}}$ signal from the control logic. The output of the gate 247 also provides, after inversion, a signal for resetting the latches 235, 236, 238 and 239 at the end of each record.

The operation of the comparison unit in the two modes can now be described.

In the normal mode, as mentioned above, $\overline{\text{REMEMBER}}$ is always equal to 37 1." Thus the output from the OR gate 248 is always "1" and hence the AND gate 247 will be enabled at the end of each record, so as to apply a write enable signal to the memory 244. Since no NULL fields are used in this mode, the latch 239 will remain reset, enabling the AND gates 241, 242, 243. Thus, it will be seen that, in this mode, the memory 244 is updated at the end of every record, by transferring the contents of the field latches into it.

In the remember mode, for the first record after a pick-up point, REMEMBER will again be equal to "1" and so the memory 244 will be updated in the normal manner. However, for subsequent records, REMEMBER goes to "0." If a match is obtained for the identifier bytes of any of the fields in such a subsequent record, one of the latches 235, 236, 238 (or the NULL latch 239 if the field is a null one) will be set, and so the OR gate 248 will still be enabled. Hence, the memory 244 will still be updated at the end of the record. (In the case of a null field, the AND gates 241-243 are disabled, and so the memory 244 is updated by zeros, signifying that the field in question is "not present"). If, on the other hand, no identifier match is obtained during the course of scanning the record, the field latches and the NULL latch will remain reset, and therefore the OR gate 248 and consequently the AND gate 247 will be disabled. As a result, the memory 244 will not be updated, but will retain the result of the comparison from the previous record. The output of the comparison unit, as seen by the SEU, is therefore exactly the same as if the field which produced the identifier match in a previous record has been repeated in the subsequent record.

Thus, it can be seen that the use of the "remember" mode permits a data file which has been compressed as described in connection with Tables 2 and 4 to give the same results from an associative search as if it was in the uncompressed form of Tables 1 and 3.

The system also provides the facility for comparing two data fields with different identifier bytes that occur in the same record. This facility could be used, for example, in a credit file system, to compare each customer's current total expenditure with his personal credit limit. This facility is referred to as the substitute search mode of operation, and uses a pair of the comparison units hereinafter referred to as comparison units A and B, whose key stores are initially loaded respectively with the identifier bytes of the two fields which it is required to compare.

Figure 17:
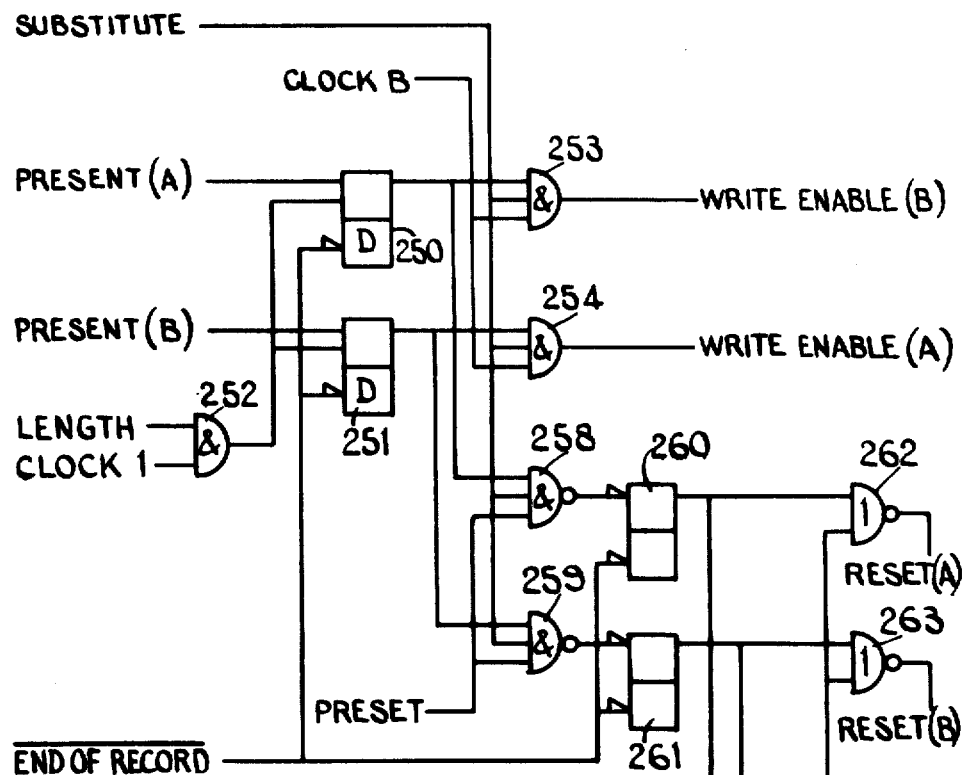

The substitute search mode of operation is controlled by a logic circuit associated with the two comparison units A and B, and shown in FIG. 17. Conveniently, this logic circuit and the two comparison units may all be constructed on the same circuit board.

Referring to FIG. 17, the substitute search logic contains a pair fo D-type bistable circuits 250 and 251 which are both clocked by the output of an AND gate 252 which receives the LENGTH signal and clock 1. Bistable 250 receives as input the set output of the bistable 232 (FIG. 16) in comparison unit A, this signal being referred to as "PRESENT (A)." Similarly, bistable 251 receives the corresponding output PRESENT (B) from comparison unit B.

The substitute search mode is initiated by a SUBSTITUTE signal, which is applied to two AND gates 253, 254 along with clock B. Gates 253, 254 also receive the set outputs of bistables 250, 251 respectively. The outputs of these gates are signals referred to as WRITE ENABLE (B) and WRITE ENABLE (A) respectively.

Figure 18:
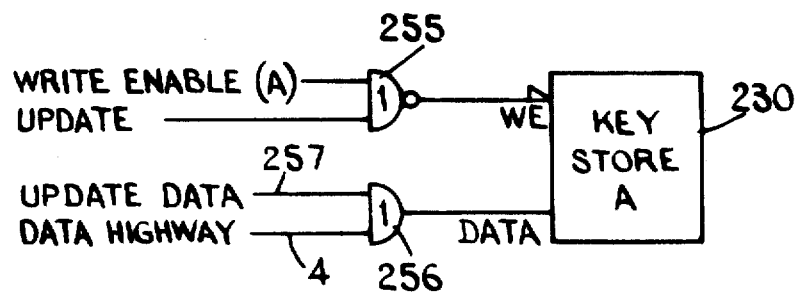

Referring to FIG. 18, the WRITE ENABLE (A) signal is applied to a NOR gate 255, the output of which is applied to the write enable terminal WE of the key store 230 of unit A. This permits data to be written into the store from the data highway 4, by way of an OR gate 256. (The other input to the NOR gate 255 is an UPDATE signal which is used when the store is to be updated from the control processor, in which case the data for updating the store is applied to the OR gate 256 over a path 257, with no data present on the data highway 4). The WRITE ENABLE (B) signal is applied to the key store of unit B in a similar manner.

Referring again to FIG. 17, the outputs of the bistables 250, 251 are also applied to respective NAND gates 258, 259, each of which also receives the SUBSTITUTE signal and the PRESET signal. The outputs of gates 258, 259 are applied to respective D-type bistables 260, 261, the outputs of which are, in turn applied to respective NOR gates 252, 263. These NOR gates also receive an input from an AND gate 264, which has applied to it as inputs: the SUBSTITUTE signal, the LENGTH signal, clock 2, and the inverses of the outputs of the bistables 260, 261. The outputs of the NOR gates 262, 263, are applied to the reset inputs of the bistables 232 (FIG. 16) in the units A and B respectively.

The operation of the system in the substitute search mode will now be described.

At the start of each record, the bistables 250, 251, 260 and 261 are all reset by the inverse of the END of RECORD signal.

Suppose that an identifier match is first detected by unit A. This results in the bistable 250 being set at clock 1 in the following length byte. The AND gate 253 is thus enabled, and produces a sequence of WRITE ENABLE (B) signals, one at each clock B pulse, causing the value portion of the data field to be written from the data highway 4 into the key store of unit B. Since both bistables 260 and 261 are reset, AND gate 264 will be enabled at clock 2 during the length byte, enabling the NOR gates 262 and 263 and thus resetting the bistable 232 in unit A. This inhibits any further comparisons in unit A during this data field. At the start of the next data field, PRESET is applied to gates 258, 259 and, since bistable 250 is still set at this point, gate 258 is enabled and bistable 260 is set and remains set until the end of the record. Gate 262 is therefore enabled, inhibiting any further identifier matches in unit A until the start of the next record. Bistable 250 is reset at the next clock 1 pulse, preventing the production of further WRITE ENABLE (B) signals.

Suppose now that an identifier match is detected by unit B for a subsequent data field in the same record. A comparison will therefore be made between the field value stored in the key store in unit B and the value portion of this subsequent data field, and the result of this comparison will be stored in the field latches of unit B in the normal manner.

When the identifier match is detected in unit B, the bistable 251 is set, causing WRITE ENABLE (A) signals to be produced, so that the second field value will be written into the store of unit A. However, this is only done to preserve the symmetry of the circuit, and the stored value is not, in fact, used by unit A, since that unit is now inhibited from making any further comparisons. The bistable 261 is set at the end of the field, producing a RESET (B) signal which inhibits any further comparisons in unit B until the end of the record.

Thus at the end of the record, the RAM 244 of unit A (the first unit to obtain an identifier match) will be updated with a "not present" indication (i.e. all zeros), while the RAM 244 of unit B will be updated with the result of the comparison of the two field values. These RAMs are then available for passing to the SEU as previously described.

It will be appreciated that, since the circuit of FIG. 17 is symmetrical with regard to unit A and B, a similar result would have been obtained if unit B had been the first to obtain an identifier match. In this case, unit B will give the "not present" indication and unit A will give the result of the value field comparison.

To cope with the multiplexing of the data, the contents of the latches 250, 251, 260 and 261 are stored away in a random access memory at the end of each group of bytes in a similar manner to that described above with reference to FIG. 13.

It should be pointed out that, in practice, the timing of the comparison units and their associated logic is delayed by one byte with respect to that of the multiplexing unit, to allow for delays in signal propagation and so on. Thus, the control signals CHANNEL NUMBER, START OF GOB and END OF GOB which pass from the multiplexing unit of these other units must be delayed by this amount. Moreover, because of delays in the comparison, it is found that the CHANNEL NUMBER applied to the memory 244 (FIG. 16) should be delayed by approximately 1¼ bytes.

Figure 19:
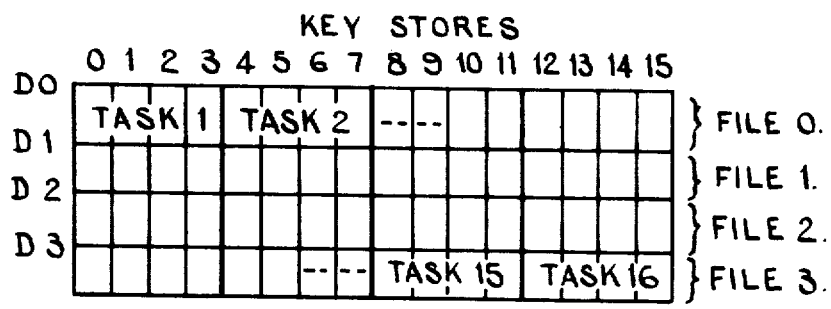
FIG. 19 illustrates a possible way of utilising the system.

An illustration of the use of the key stores in the comparison units will now be given with reference to FIG. 19. In this figure, the key stores of the sixteen comparison units are shown side-by-side for convenience, each column representing a key store. It is assumed that information from four files is to be processed, each file having a differennt set of key values. Four datum values D0-D3 are therefore loaded into the datum memory 120 (FIG. 11). These values effectively partition the key stores into four areas (not necessarily of equal size), one of each file as indicated in FIG. 19. Each key store can therefore hold four key values (each small rectangle in FIG. 18 represents the area available for a key value).

In addition to the above "horizontal" partitioning of the key stores, the comparison units may also be regarded as being partitioned "verticaly" into groups. In this example, the units are partitioned into four groups of four units each as indicated by the heavy vertical lines. Each group of comparison units can then be allocated to a separate search task on the same files. Thus, it will seen that, in this example, the horizontal and vertical partitioning together permit 16 separate search tasks to be in progress at the same time, four tasks for each file.

It should be noted that the partitioning of the comparison units into groups is determined by the way in which the search evaluation unit processes the results from the comparison units.

SEARCH EVALUATION UNIT

The search evaluation unit (SEU) will now be described in more detail with reference to FIGS. 20–25.

Figure 20:
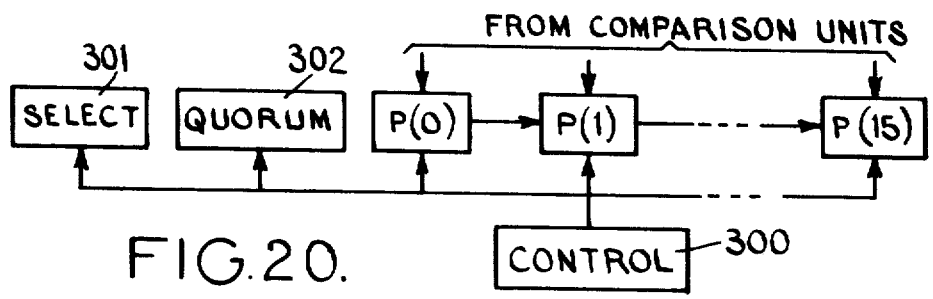
FIGS. 20 – 25 show the search evaluation unit.

Referring to FIG. 20, the SEU comprises 16 processing elements P(0) – P(15), one for each comparison unit 5. The processing elements have a common control unit 300, select function unit 301, and quorum function unit 302. As indicated, each processing element can transfer data to the following element in the sequence. (The last element in the sequence may be connected back to the first, so as to form a closed loop of elements).

Figure 21:
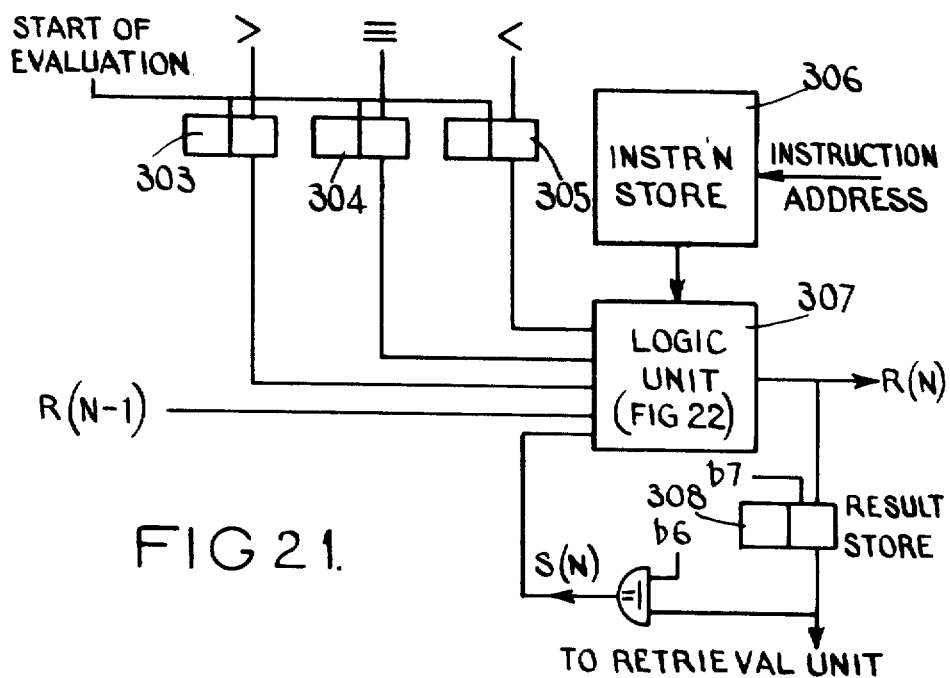

FIG. 21 shows the structure of one of the processing element P(N). This includes three latches 303–305 which receive the relational information (greater than, equal to, less than) from the result memory 244 (FIG. 16) of the associated comparison unit. These results are clocked into the latches by a START OF EVALUATION signal.

The processing element has an instruction store 306 which can hold one or more sequences of nine-bit microinstructions, up to a total of 32 microinstructions. The maximum length of a given sequence is 15 microinstructions. The reason for this is that the longest sequence must be completed within 16 byte periods (the minimum record length).

Microinstructions are read out of the instruction store 306 one at a time by INSTRUCTION ADDRESS signals from the control unit 300, and are applied to a logic unit 307. The output of the unit 307 is a binary signal R(N) which can be stored in a latch 308 referred to as the result store. The logic unit receives as its data inputs: the contents of the three latches 303–305, the output S(N) from its result store, and the output $R(N-1)$ from the logic unit of the preceding processing element $P(N-1)$.

Figure 22:
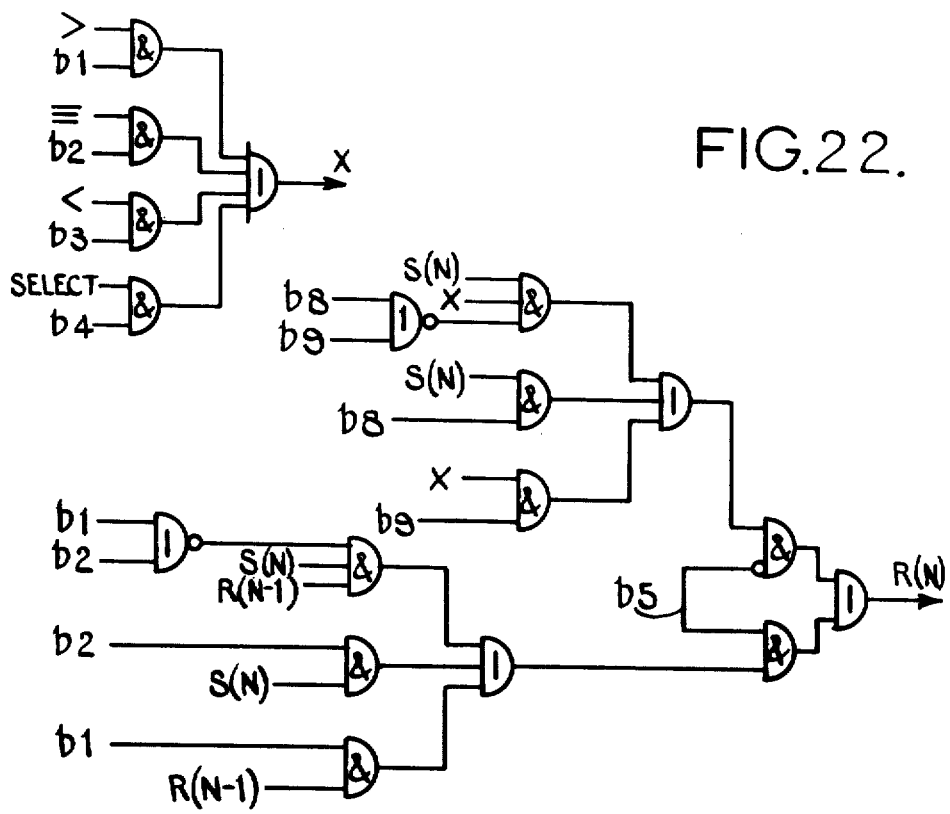

Referring now to FIG. 22, this shows the logic unit 307 in greater detail. For convenience, the symbols $b1$–$b9$ will be used to represent the nine bits of the current microinstruction, while the greater than, equals, and less than symbols represent the outputs of the corresponding latches 303–305.

The unit has two modes of operation. In the first mode, determined by $b5=0$, the output R(N) is as follows:

| b8,b9 | R(N) |
|---|---|
| 00 | S(N) AND X |
| 01 | X |
| 10 | S(N) |
| 11 | S(N) OR X | where X represents an OR function of the relational information from the latches 303–305. The exact nature of this OR function is determined by $b1$–$b3$. Also if $b4=1$, the output SELECT from the select function unit is included in this OR function.

In the second mode, determined by $b5=1$, the output R(N) is as follows:

| b1,b2 | R(N) |
|---|---|
| 00 | S(N) AND R(N-1) |
| 01 | S(N) |
| 10 | R(N-1) |
| 11 | S(N) OR R(N-1) |

Bit $b7=1$ causes the result R(N) to be written into the result store, while bit $b6=1$ causes the output S(N) to the result store to be inverted. (See FIG. 21).

Figure 23:
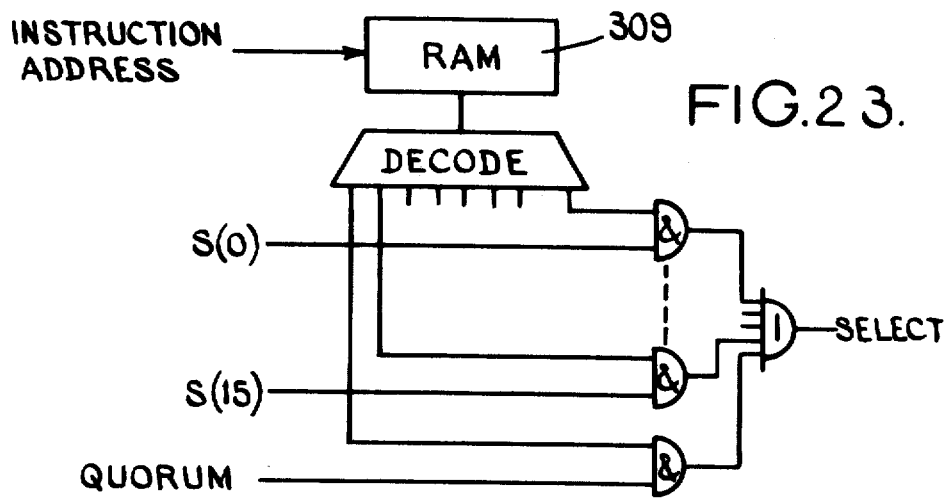

Referring now to FIG. 23, the select function unit 301 comprises a random access memory 309 having 32 word locations, addressed by the INSTRUCTION ADDRESS from the control unit. Each of these locations contains an address specifying one of the processing elements P(N), and is decoded to select the result store output S(N) of that element as the output signal SELECT. This signal is applied to all the processing elements, as explained above with reference to FIG. 22.

It can be seen that the select function unit thus provides the facility for transferring information from the result store of any selected processing element to the logic unit of any other element.

Figure 24:
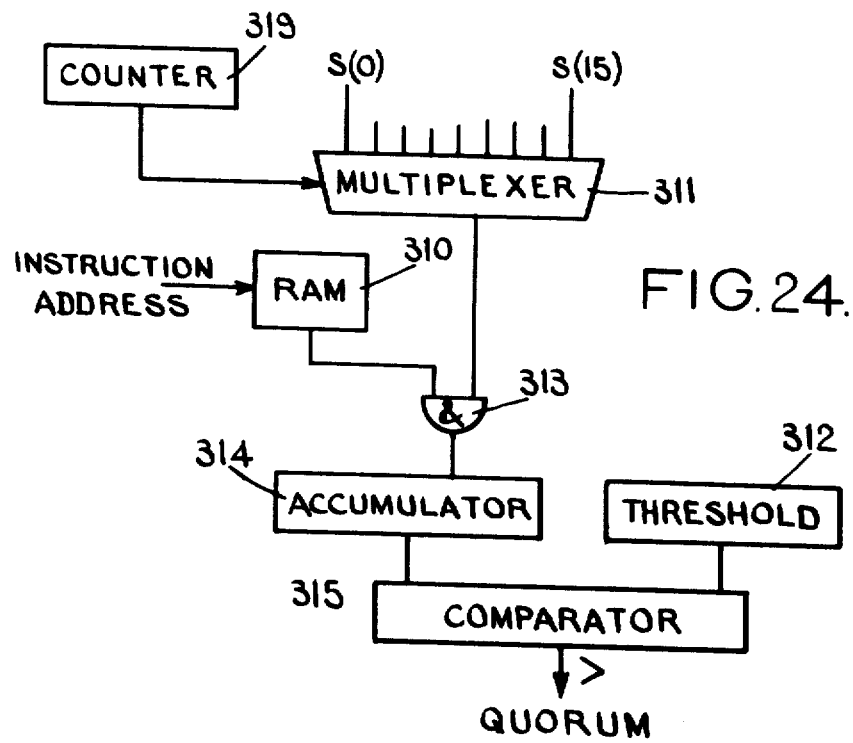

Referring now to FIG. 24, the quorum function unit comprises a random access memory 310 having 32 word locations addressed by INSTRUCTION ADDRESS. This unit also includes a multiplexer 311 which selects one of the outputs S(0)-S(15) from the processing elements in accordance with the contents of a four-bit counter 319.

In operation, as each microinstruction sequence is executed by the processing elements, a corresponding sequence of locations in the memory 310 will be addressed. The first location of this sequence is arranged to contain a seven-bit threshold value while the subsequent locations contain a set of weight values.

While the first microinstruction in the sequence is being executed by the processing elements, the threshold value is read from the memory 310, and is loaded into a register 312. The INSTRUCTION ADDRESS is then incremented, the counter 319 reset to zero, and the multiplexer 311 enabled.

While the next microinstruction in the sequence is being executed, the first weight value is read out of the memory 310, while at the same time the multiplexer 311 selects output S(0). If S(0)=1, a set of AND gates 313 is enabled, causing the weight value to be gated into an accumulator register 314 where it is added to the contents of the accumulator (assumed to have been initially set to zero).

This process will continue for each succeeding address, so that the outputs S(0), S(1), S(2) and so on will in turn be logically ANDed with their corresponding weight values and added to the total in the accumulator.

The accumulated total is continuously compared in a circuit 315 with the threshold value in the register 312, and when it exceeds the threshold value a QUORUM signal is produced. As indicated in FIG. 23, this signal is available for selection by the select function unit in the same manner as any of the result store outputs.

The quorum function thus provides the facility for adding together a series of weighted results from the individual processing elements and determining whether the sum exceeds a threshold value. Not all the processing elements have to contribute to the sum: those that are not required have their weight values set to zero.

It should be noted that each result store must be set up as required before it is used by the quorum function. Thus, the evaluation sequence for processor P(N) must not take longer than N+1 microinstructions. For example, the evaluation sequence for processor P(0) must take only one instruction. Moreover, since the quorum function takes the equivalent of N+1 microinstructions to evaluate the outputs from N processing elements, the QUORUM output for those N elements cannot be selected until the N+2nd microinstruction of the select function unit.

As an example of the use of the quorum function, suppose it is required to determine whether the results of the evaluations performed by any four out of the first eight processing elements are true. The weights for these eight elements would all be set to one, the rest being zero, and the threshold value would be set to three. In this case, the evaluation of the quorum function is completed after nine microinstructions, and the quorum output may be selected by the tenth microinstruction of the select function.

Figure 25:
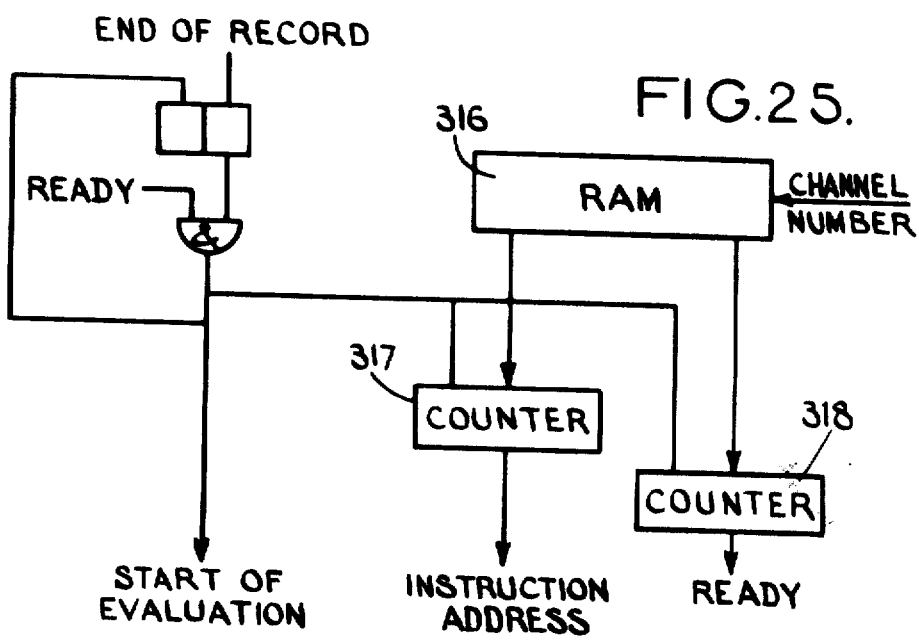

Referring now to FIG. 25, this shows the control unit 300. The unit includes a random access memory 316 which is addressed by the CHANNEL NUMBER and which contains in each location, the start address of a microprogram sequence approriate to the channel in question. Each location also contains a sequence length.

Operation of the control unit is initiated by an END OF RECORD signal which (provided the SEU is not already busy) causes an instruction counter 317 to be loaded with the appropriate start address for the channel in question, and causes a sequence length counter 318 to be loaded with the corresponding sequence length. The instruction counter is then incremented so as to produce a sequence of INSTRUCTION ADDRESS signals which are broadcast to the processing elements, the select function unit, and the quorum function unit. At the same time, the length counter is decremented, and when it reaches zero the sequence is terminated and a READY signal is issued. This indicates to the retrieval unit 10 (FIG. 1) that the evaluation of the results for the record in question is now complete, and available for inspection in the result stores of the processing elements.

It should be appreciated that since the search evaluation unit consists of a number (16) of processing elements, which act in parallel, it has considerable processing power, since a number of different operations can be performed for each microinstruction step. Moreover, the processing elements may be partitioned into groups, with each group performing a separate evaluation task. For example, consider the arrangement mentioned above with reference to FIG. 19. In this case, the processing elements would be partitioned into groups of four, each group evaluating the relational information from the corresponding group of key stores. In this example, each processing element would contain four sequences of microinstructions, one of each file corresponding to the four horizontal divisions in FIG. 19.

SOME POSSIBLE MODIFICATIONS

It will be appreciated that many different modifications may be made to the system described above without departing from the scope of the invention.

For example, the number of data channels which are time-division multiplexed together may be varied. The limitation is that the comparison units must be able to handle all the information. Likewise, the number of comparison units may also be varied, according to requirements.

Another possible modification would be to replace the double buffer arrangement in each channel unit by single first-in first-out ripple through memory.

In another possible modification, the comparison units could be modified so that the comparison of a given data field is terminated if the length byte of that field is smaller than the length byte contained in the key store, which might be desirable in some circumstances. This could be achieved by ANDing together Clock 2, the LENGTH signal, and the "less than" output of the comparator 231 (FIG. 15.), ORing this with the output of the gate 227 (FIG. 16), and using the result to reset the latch 232.

The features of the above described system relating to the multiplexing of data on to a common highway and operating upon the multiplexed data by a plurality of time-shared comparison units in parallel form the subject of copending application Ser. No. 602,272 by M. W. Martin, R. W. Mitchell and D. R. Webb.

The features of the above described system relating to the use of a variable trailer field to permit the boundaries between records to be effectively altered form the subject of copending application Ser. No. 602,274 by Edward Babb.

The features of the above described system relating to the structure of the search evaluation unit form the subject of copending application Ser. No. 602,275 by R. W. Mitchell and D. R. Webb.

All three of the above mentioned copending applications are assigned to the same assignee as the present application.

I claim:

1. A data processing system comprising:
   a. a data storage unit holding a sequence of records, each record comprising at least one data item;
   b. an intermediate result store;
   c. means for storing a search key;
   d. comparison means connected to receive data in said sequence from the data storage unit, for performing comparison operations between each data item so received and said search key and writing any result of those comparison operations into the intermediate result store;
   e. means connected to receive data in said sequence from the data storage unit, concurrently with reception of that data by the comparison means, for producing an end of record signal upon detection of the end of each said record;
   f. means connected to the intermediate result store for producing an enable signal upon detection of the presence of a result in the intermediate result store;
   g. a final result store connected to receive data from the intermediate result store; and
   h. means responsive to said end of record signal simultaneously with said enable signal for causing transfer of data from the intermediate result store to the final result store.

2. A data processing system comprising:
   a. a data storage unit holding a sequence of records, each record comprising at least one data item and each item having an identifier portion and a value portion;
   b. an intermediate result store;
   c. means for storing a search key, the search key having an identifier portion and a value portion;
   d. first comparison means connected to receive data in said sequence from the data storage unit, for comparing the identifier portion of each data item with the identifier portion of the search key and producing a hit signal in the event that the identifier portions of the data item and the search key match each other;
   e. second comparison means connected to receive data in said sequence from the data storage unit and responsive to said hit signal for performing a comparison operation between the value portion of the data item whose identifier portion matched the identifier portion of the search key, and the value portion of the search key, and writing the result of that comparison into the intermediate result store;
   f. means connected to receive data in said sequence from the data storage unit, concurrently with reception of that data by the first and second comparison means, for producing an end of record signal upon detection of the end of each of said record;
   g. means connected to the intermediate result store, for producing an enable signal upon detection of the presence of a result in the intermediate result store;
   h. a final result store connected to receive data from the intermediate result store; and
   i. means responsive to said end of record signal simultaneously with said enable signal for causing transfer of data from the intermediate result store to the final result store.

3. A system according to clam 2 further including means responsive to said end of record signal simultaneously with said enable signal for resetting said intermediate result store.

4. A system according to claim 2 wherein said sequence of records includes pick-up points separating groups of adjacent records, the system further including: means connected to receive data in said sequence from the data storage unit, for producing a predetermined signal upon detection of a pick-up point, and means responsive to said predetermined signal simultaneously with said end of record signal for causing transfer of data from the intermediate result store to the final result store.

* * * * *